United States Patent
Mrvos et al.

(10) Patent No.: US 6,668,445 B1
(45) Date of Patent: Dec. 30, 2003

(54) METHOD OF INCREASING TAB BOND STRENGTH USING REACTIVE ION ETCHING

(75) Inventors: James Michael Mrvos, Lexington, KY (US); Michael Raulinaitis, Lexington, KY (US); Carl Edmond Sullivan, Versailles, KY (US)

(73) Assignee: Lexmark International, Inc., Lexington, KY (US)

( * ) Notice: Subject to any disclaimer, the term of this patent is extended or adjusted under 35 U.S.C. 154(b) by 0 days.

(21) Appl. No.: 09/481,254

(22) Filed: Jan. 11, 2000

(51) Int. Cl.[7] .................................................. H05B 3/00
(52) U.S. Cl. .......................... 29/611; 29/1; 29/854; 29/890.1; 216/27; 216/33; 216/34; 216/35; 216/41; 216/49; 347/58; 347/63; 438/725; 438/906
(58) Field of Search ................... 29/611, 890.1, 29/854; 216/27, 33, 34, 35, 41, 49, 51, 67; 134/1.1; 438/725, 906; 347/58, 63

(56) References Cited

U.S. PATENT DOCUMENTS

| | | | |
|---|---|---|---|
| 4,635,073 A | * | 1/1987 | Hanson ....................... 346/1.1 |
| 4,707,418 A | | 11/1987 | Takiar et al. |
| 4,810,326 A | * | 3/1989 | Babu ............................. 156/629 |
| 5,106,471 A | * | 4/1992 | Galvin et al. .......... 204/192.35 |
| 5,152,054 A | | 10/1992 | Kasahara |
| 5,200,808 A | * | 4/1993 | Koyama et al. ............. 257/750 |
| 5,350,484 A | * | 9/1994 | Gardner et al. ............. 156/628 |
| 5,459,353 A | * | 10/1995 | Kanazawa ................... 257/751 |
| 5,519,421 A | * | 5/1996 | Barr .............................. 347/47 |
| 5,552,335 A | * | 9/1996 | Mahon et al. ................. 438/53 |
| 5,712,194 A | * | 1/1998 | Kanazawa ................... 437/194 |
| 5,716,533 A | * | 2/1998 | O'Neill ......................... 216/27 |
| 5,755,032 A | | 5/1998 | Pan et al. |
| 5,764,485 A | | 6/1998 | Lebaschi |
| 5,788,870 A | * | 8/1998 | Nguyen et al. ................ 216/63 |
| 5,825,385 A | | 10/1998 | Silverbrook |
| 5,850,241 A | | 12/1998 | Silverbrook |
| 5,852,460 A | | 12/1998 | Schaeffer et al. |
| 5,990,007 A | * | 11/1999 | Kajita et al. ................. 438/680 |
| 5,994,156 A | * | 11/1999 | Voutsas et al. ............... 438/30 |
| 6,022,805 A | * | 2/2000 | Sumi .......................... 438/677 |
| 6,039,439 A | * | 3/2000 | Komplin et al. .............. 347/65 |
| 6,074,566 A | * | 6/2000 | Hsiao ............................ 216/2 |
| 6,103,135 A | * | 8/2000 | Kusner ......................... 216/20 |
| 6,140,243 A | * | 10/2000 | Wallace et al. ............. 438/700 |
| 6,163,463 A | * | 12/2000 | Marrs ......................... 361/773 |
| 6,230,400 B1 | * | 5/2001 | Tzanavaras et al. .......... 29/840 |
| 6,245,249 B1 | * | 6/2001 | Yamada ........................ 216/33 |

* cited by examiner

*Primary Examiner*—Peter Vo
*Assistant Examiner*—Paul Kim
(74) *Attorney, Agent, or Firm*—Taylor & Aust, P.C.

(57) ABSTRACT

A method of tape automated bonding a heater chip of an ink jet printer to a flexible circuit includes the step of attaching an electrically conductive bonding pad to a first portion of a surface of the heater chip. A mask is applied to a second portion of the surface of the heater chip. An exposed surface of the bonding pad is chemical dry etched for a predetermined time period to thereby remove contaminants from the etched exposed surface. The chemical dry etching is terminated at an end of the predetermined time period such that substantially none of the bonding pad is removed. Lastly, the flexible circuit is electrically connected to the etched exposed surface.

19 Claims, 1 Drawing Sheet

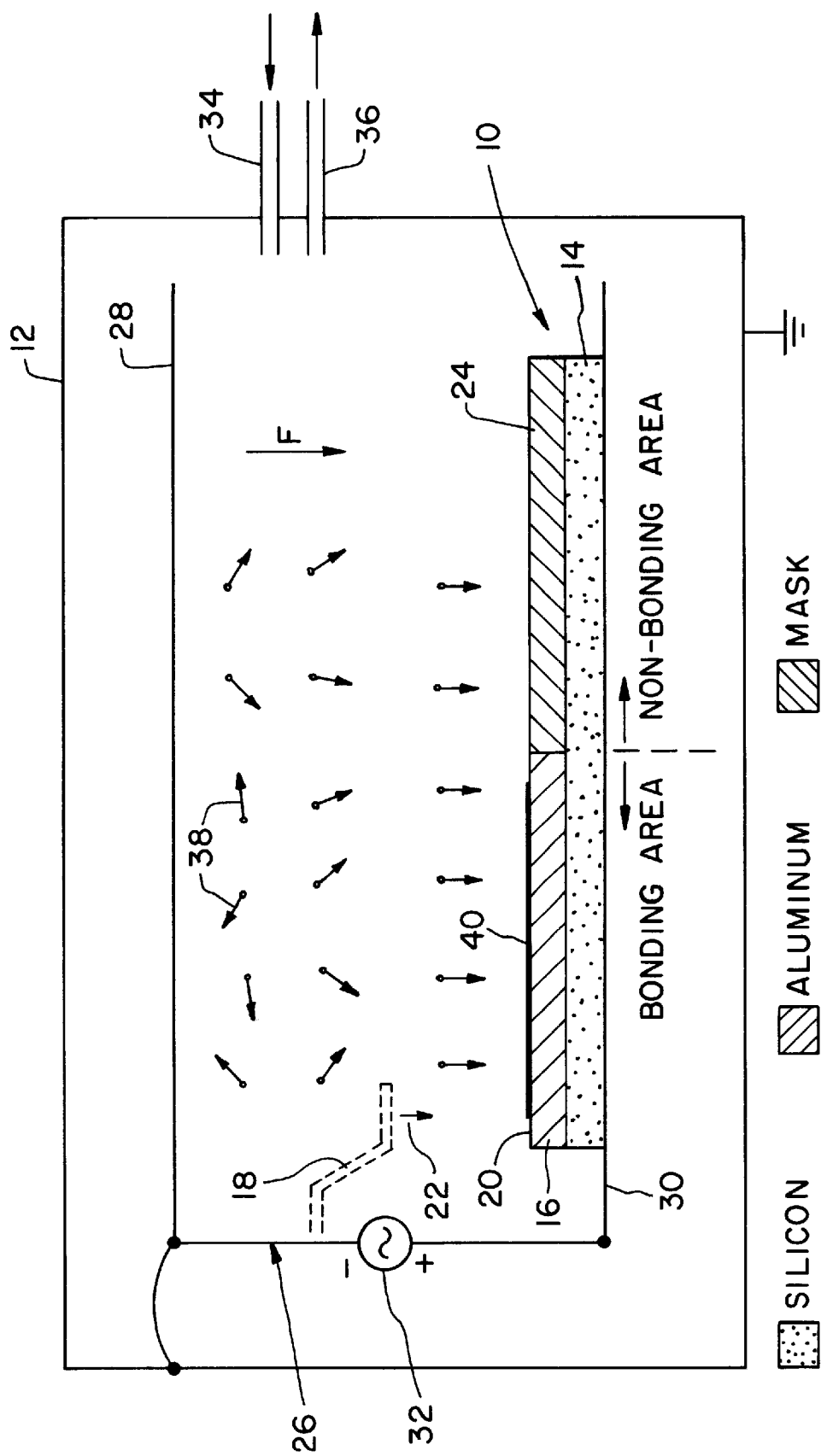

METHOD OF INCREASING TAB BOND STRENGTH USING REACTIVE ION ETCHING

BACKGROUND OF THE INVENTION

1. Field of the Invention

The present invention relates to a method of TAB bonding, and, more particularly, to a method of attaching a beam of a flexible circuit to a bonding pad.

2. Description of the Related Art

Tape Automated Bonding (TAB) is used within the ink jet printer industry as a way of interconnecting a heater chip and a flexible circuit. The heater chip is a multi-layered device in which ink is heated in order to cause the ink to be jetted out of orifices or nozzles in the heater chip toward a print medium. The flexible circuit carries power to the heater chip in order to selectively energize the ink emitting nozzles. The bonding pads are patterned in a thin film process of fabricating the heater chip, which may include sputtering, chemical vapor deposition, etching and/or photolithography. The flexible circuit includes finger-like beams which are bonded or welded to the aluminum bonding pad on the heater chip. The bonding may be performed with ultrasonic, thermosonic or thermocompression bonding. A problem is that the TAB bond between the flexible circuit and the heater chip is known to fail due to poor bond strength. The poor bond strength can be attributed to many different factors, including contaminated bond pads or non-optimized bonding parameters. Since the TAB circuit is one of the most expensive parts within an ink jet print head, the scrap cost associated with TAB bond failure significantly increases the overall cost of the ink jet printhead.

What is needed in the art is an improved method of TAB bonding a flexible circuit to a bonding pad of a heater chip, such that higher bond strength and less bond failures are achieved.

SUMMARY OF THE INVENTION

The present invention provides a method of removing dirt or other contaminants from the surface of a bonding pad before TAB bonding is performed between the flexible circuit and the bonding pad of the heater chip.

The invention comprises, in one form thereof, a method of tape automated bonding a heater chip of an ink jet printer to a flexible circuit. The method includes the step of attaching an electrically conductive bonding pad to a first portion of a surface of the heater chip. A mask is applied to a second portion of the surface of the heater chip. An exposed surface of the bonding pad is chemical dry etched for a predetermined time period to thereby remove contaminants from the etched exposed surface. The chemical dry etching is terminated at an end of the predetermined time period such that substantially none of the bonding pad is removed. Lastly, the flexible circuit is electrically connected to the etched exposed surface.

An advantage of the present invention is that various contaminants are removed from the surface of the bonding pad which is to be TAB bonded to the flexible circuit, thereby resulting in higher bond strength and higher production yields.

Another advantage is that the cleaning process does not remove substantial amounts of material from the surface of the bonding pad, thereby leaving the bonding pad intact for TAB bonding.

BRIEF DESCRIPTION OF THE DRAWINGS

The above-mentioned and other features and advantages of this invention, and the manner of attaining them, will become more apparent and the invention will be better understood by reference to the following description of an embodiment of the invention taken in conjunction with the accompanying drawing, which is a side view of one embodiment of the method of the present invention, in which a heater chip is placed inside a reactive ion etching (RIE) chamber.

The exemplification set out herein illustrates one preferred embodiment of the invention, in one form, and such exemplification is not to be construed as limiting the scope of the invention in any manner.

DETAILED DESCRIPTION OF THE INVENTION

Referring now to the drawing there is shown a heater chip 10 disposed within a reactive ion etching chamber 12. Heater chip 10 includes a silicon substrate 14 attached to an aluminum bonding pad 16. A beam 18 of a flexible circuit is shown schematically in a dotted line and will be placed on an upper surface 20 of bonding pad 16, as indicated by arrow 22, in order to TAB bond the flexible circuit to heater chip 10 after heater chip 10 has been withdrawn from RIE chamber 12. Thus, bonding pad 16 defines the extent of the bonding area on heater chip 10. Immediately, adjacent to bonding pad 16 on silicon substrate 14 is a mask layer 24 for protecting silicon substrate 14 while substrate 14 is in RIE chamber 12, as will be discussed in more detail below. Mask 24 may be formed of either silicon nitride, photo resist or polyimide, or another known etch mask or a combination of the above masks.

RIE chamber 12 includes a grounded housing 26 containing two planar electrodes, including a grounded electrode 28 and a positive potential electrode 30. Heater chip 10 is laid flat upon positive electrode 30 such that heater chip 10 is disposed between electrodes 28 and 30. A radio frequency (RF) power supply 32 applies a voltage potential across electrodes 28 and 30. A gas inlet 34 carries a gas, i.e., a neutral ionized gas containing a large number of free electrons and charged ions, into RIE chamber 12 between electrodes 28 and 30. The gas forming the plasma may be oxygen ($O_2$), carbon tetraflouride ($CF_4$) and/or other gases known in the art. RF power supply 32 provides constant energy to the plasma in order to offset the recombination of the charged particles in the plasma, and thereby maintain the plasma in an ionized state. The plasma must also be kept at low pressure in order to reduce the collision rate and thus the recombination rate of the ions. To produce the low pressure, a vacuum pump continuously pumps against the chamber 12 through gas outlet 36, removing contaminants and residual gases, in order to maintain an equilibrium pressure (not shown).

In operation, the applied electrical field F from outlet power supply 32 strips the free electrons, with which plasma formation begins, from gas atoms. Once available, the electrons are accelerated by the applied field F and collide with gas molecules with several effects, such as ionization, dissociation and excitation, as is well known in the art.

Since the plasma is an electrical conductor, the interior of the plasma is at a uniform electric potential. Both electrons and ions escape from the plasma and are neutralized on the walls of chamber 12. However, the electrons escape more easily because they are much smaller and more mobile. Thus, a surplus of positive ions are left in the plasma, resulting in a positive charge. Ions 38 leaving the plasma initially have a rather random direction of movement, as shown by the ions nearest to electrode 28 in the drawing. The electric field F across electrodes 28 and 30 tends to redirect ions 38, causing them to acquire a velocity substantially parallel to the electric field F. As ions 38 are accelerated along the electric field F, they eventually collide with bonding pad 16 at an angle that is substantially perpendicular to surface 20. Mask 24 provides a protective layer to prevent ions 38 from damaging silicon substrate 14.

With the method of the present invention, an anisotropic etching is achieved, i.e., the downward etch rate is much larger than the lateral etch rate, resulting in a very evenly distributed etching of upper surface 20 of bonding pad 16. The perpendicular bombardment of surface 20 of bonding pad 16 as discussed above is what causes the etching to be anisotropic in nature.

At sufficiently high energies, the bombarding ions 38 erode surface 20 as they strike it, a process known as "sputtering". Sputtering is a very unselective process in which chemical bonds are broken due to impact. Ion bombardment at lower energies results in chemical etching by locally heating bonding pad 16 and by loosening chemical bond.

Etching that is highly dependent upon such ion imbardment is referred to as reactive ion etching (RIE). In reactive ion etching, an additional potential is applied to electrodes 28 and 30 so that ion bombardment energies exceed the plasma potential. Reactive ion etching is characterized by the substrate electrode 30 being connected to the RF power supply and the other electrodes 28 being grounded. This configuration allows a high potential between bonding pad 16 and the plasma. If this configuration were reversed, a lower bias would be produced, which is characteristic of the plasma mode.

A thin layer of contamination 40, e.g., formed of aluminum oxide, debris, organic matter, etc., is present on upper surface 20 of bonding pad 16. Heater chip 10 is exposed to reactive ion etching for a time period that is long enough for the bombardment of ions 38 to remove contaminants 40 from surface 20, but is not long enough to cause any depression to be formed in surface 20, such as by removing the aluminum of bonding pad 16 itself. Thus, surface 20 remains substantially intact. This time period is approximately between 30 seconds and 10 minutes, and preferably is approximately between 2 minutes and 7 minutes, and more preferably between 4 minutes and 7 minutes. The anisotropic nature of reactive ion etching results in a uniform cleaning of surface 20, without penetrating into the aluminum of bonding pad 16. By removing contaminants 40 from bonding pad 16, a stronger bond may be formed between beam 18 and surface 20 in the TAB bonding process. After the reactive ion etching process removes contaminants 40, contaminants 40 are carried away by reactions with a stream of oxygen and/or carbon tetraflouride gas within chamber 12.

A throttle valve (not shown) may be fitted on the vacuum pump to allow pressure and gas residence time within chamber 12 to be varied independently. The operating pressure within chamber 12 is set to be between approximately 100 mTorr and 500 mTorr during the reactive ion etching process, and preferably is approximately between 150 mTorr and 200 mTorr. The operating gasses, such as oxygen and carbon tetraflouride, flow through chamber 12 at a rate of approximately between 1 and 250 standard cubic centimeters per minute (sccm). Each gas is regulated separately with a mass flow controller within a range of between 1 and 250 sccm, preferably between 1 and 50 sccm.

After the reactive ion etching has taken place and contaminants 40 have been removed, heater chip 10 can be removed from chamber 12. Mask layer 24 may then be removed by any conventional process, and beam 18 is TAB bonded to surface 20 of bonding pad 16. (The protective layer may not need to be removed or may already be built into the chip).

In the method shown, reactive ion etching is used to remove contaminants 40 from bonding pad 16. However, it is to be understood that any kind of dry etching, such as chemical dry etching and/or anisotropic dry etching can also be used to remove contaminants 40.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A method of tape automated bonding a heater chip of an ink jet printer to a flexible circuit, said method comprising the steps of:

attaching an electrically conductive bonding pad to a first portion of a surface of said heater chip, said first portion being a bonding area of said surface of said heater chip, said bonding pad having an exposed surface with contaminants thereon;

applying a mask to a second portion of said surface of said heater chip, said second portion being a non-bonding area of said surface of said heater chip;

chemical dry etching said exposed surface of said bonding pad for a predetermined time period to thereby remove said contaminants from said exposed surface of said bonding pad to define an etched exposed surface of said bonding pad;

terminating said chemical dry etching at an end of said predetermined time period such that substantially none of said bonding pad is removed; and electrically connecting said flexible circuit to said etched exposed surface of said bonding pad.

2. The method of claim 1, comprising the further step of removing said mask from said second portion of said surface of said heater chip.

3. The method of claim 1, wherein said bonding pad comprises any electrically conductive bonding pad.

4. The method of claim 3, wherein said bonding pad comprises one of an aluminum and aluminum alloy bonding pad.

5. The method of claim 1, wherein said surface of said heater chip comprises an upper surface of said heater chip.

6. The method of claim 1, wherein said mask comprises a layer of one of silicon nitride, photo resist and polyimide.

7. The method of claim 1, wherein said chemical dry etching comprises anisotropic dry etching.

8. The method of claim 7, wherein said chemical dry etching comprises reactive ion etching.

9. The method of claim 8, wherein said reactive ion etching is performed at an operating pressure of approximately between 100 mTorr and 500 mTorr.

10. The method of claim 9, wherein said operating pressure is approximately between 150 mTorr and 200 mTorr.

11. The method of claim 8, wherein said reactive ion etching is performed with a flow of at least one of oxygen and carbon tetrafluoride being approximately between 1 sccm and 250 sccm.

12. The method of claim 1, wherein said predetermined time period is approximately between 30 seconds and 10 minutes.

13. The method of claim 12, wherein said predetermined time period is approximately between 2 minutes and 7 minutes.

14. The method of claim 1, wherein said flexible circuit includes at least one beam, said electrically interconnecting step including bonding said at least one beam to said etched exposed surface.

15. The method of claim 14, wherein said bonding comprises one of ultrasonic, thermosonic and thermocompression bonding.

16. The method of claim 1, wherein said heater chip includes a silicon substrate.

17. A method of tape automated bonding a heater chip of an ink jet printer to a flexible circuit, said method comprising the steps of:

attaching an electrically conductive bonding pad to a surface of said heater chip, said bonding pad having an exposed surface with contaminants thereon;

reactive ion etching said exposed surface of said bonding pad for a time period such that substantially only said contaminants on said exposed surface are removed and said exposed surface remains substantially intact; and electrically connecting said flexible circuit to said exposed surface.

18. A method of tape automated bonding a heater chip of an ink jet printer to a flexible circuit, said method comprising the steps of:

attaching an electrically conductive bonding pad to a bonding area of a surface of said heater chip, said bonding pad having an exposed surface with contaminants thereon;

chemical dry etching said exposed surface of said bonding pad for a predetermined time period to thereby remove said contaminants from said exposed surface of said bonding pad to define an etched exposed surface of said bonding pad;

terminating said chemical dry etching at an end of said predetermined time period such that substantially none of said bonding pad is removed; and electrically connecting said flexible circuit to said etched exposed surface of said bonding pad.

19. A method of tape automated bonding a heater chip of an ink jet printer to a flexible circuit, said method comprising the steps of:

attaching an electrically conductive bonding pad to a bonding area of a surface of said heater chip, said bonding pad having an exposed surface with contaminants thereon;

applying a mask to a non-bonding area of said surface of said heater chip;

chemical dry etching said exposed surface of said bonding pad for a predetermined time period to thereby remove said contaminants from said exposed surface of said bonding pad to define an etched exposed surface of said bonding pad;

terminating said chemical dry etching at an end of said predetermined time period such that substantially none of said bonding pad is removed; and electrically connecting said flexible circuit to said etched exposed surface of said bonding pad.

* * * * *

UNITED STATES PATENT AND TRADEMARK OFFICE
CERTIFICATE OF CORRECTION

PATENT NO. : 6,668,445 B1
DATED : December 30, 2003
INVENTOR(S) : James Michael Mrvos, Michael Raulinaitis and Carl Edmond Sullivan It is certified that error appears in the above-identified patent and that said Letters Patent is hereby corrected as shown below:

Column 2,
Line 12, after the phrase "The exemplification" insert -- figure --;

Column 5,
Line 24, before the phrase "surface of the said heater chip" insert -- portion of a --;
Line 24, after the phrase "surface of the said heater chip," insert -- applying a mask to another portion of said surface of said heater chip, --;
Line 27, before the phrase "time period" insert -- predetermined --;
Line 37, before the phrase "surface of said" insert -- portion of a --.

Signed and Sealed this

Twentieth Day of April, 2004

JON W. DUDAS
*Acting Director of the United States Patent and Trademark Office*